(12) United States Patent
Tseng et al.

(10) Patent No.: US 9,862,133 B1
(45) Date of Patent: Jan. 9, 2018

(54) MOLDING SYSTEM FOR PREPARING AN INJECTION MOLDED FIBER REINFORCED COMPOSITE ARTICLE

(71) Applicant: CORETECH SYSTEM CO., LTD., Hsinchu County (TW)

(72) Inventors: Huan Chang Tseng, Hsinchu County (TW); Rong Yeu Chang, Hsinchu County (TW); Chia Hsiang Hsu, Hsinchu County (TW)

(73) Assignee: CORETECH SYSTEM CO., LTD., Hsinchu County (TW)

( * ) Notice: Subject to any disclaimer, the term of this patent is extended or adjusted under 35 U.S.C. 154(b) by 0 days.

(21) Appl. No.: 15/449,436

(22) Filed: Mar. 3, 2017

Related U.S. Application Data

(60) Provisional application No. 62/437,292, filed on Dec. 21, 2016.

(51) Int. Cl.
*B29C 45/76* (2006.01)
*B29C 45/00* (2006.01)
*B29C 45/77* (2006.01)
*G06F 17/50* (2006.01)
*B29K 309/08* (2006.01)
(Continued)

(52) U.S. Cl.
CPC ...... *B29C 45/7693* (2013.01); *B29C 45/0005* (2013.01); *B29C 45/0046* (2013.01); *B29C 45/77* (2013.01); *G06F 17/50* (2013.01); *B29C 2045/0006* (2013.01); *B29C 2045/0098* (2013.01); *B29C 2945/76652* (2013.01); *B29K 2101/12* (2013.01); *B29K 2307/04* (2013.01); *B29K 2309/08* (2013.01); *B29K 2905/00* (2013.01)

(58) Field of Classification Search
CPC .................................................. B29C 45/7693
See application file for complete search history.

(56) References Cited

U.S. PATENT DOCUMENTS 8,571,828 B2    10/2013  Tseng et al.
2014/0200710 A1*  7/2014  Chang ................. B29C 45/7693
                                                700/197

OTHER PUBLICATIONS

Wang J. Improved fiber orientation predictions for injection molded composites. Ph.D. Thesis,University of Illinois at Urbana-Champaign; 2007.
(Continued)

*Primary Examiner* — Benjamin A Schiffman
(74) *Attorney, Agent, or Firm* — WPAT, P.C., Intellectual Property Attorneys; Anthony King

(57) ABSTRACT

The present disclosure provides a method for preparing an injection-molded fiber-reinforced composite article using a molding machine controlled by a controlling module connected to the molding machine. The method performs a molding simulation executed on the controlling module to generate a shear rate distribution of the composite molding resin in a simulating domain. Subsequently, the method generates an orientation distribution of the fibers in the composite molding resin executed on the controlling module by taking into consideration an effect of the shear rate on an inter-fiber interaction and/or an effect of the shear rate on reducing a response rate of the fibers. A controller then controls the molding machine with the molding condition to perform an actual molding for injecting the composite molding resin into at least a portion of the mold cavity.

6 Claims, 18 Drawing Sheets

(51) Int. Cl.
*B29K 307/04* (2006.01)
*B29K 101/12* (2006.01)

(56) References Cited

OTHER PUBLICATIONS

Phelps JH. Processing-microstructure models for short- and long-fiber thermoplastic composites. Ph.D. Thesis, University of Illinois at Urbana-Champaign; 2009.

Tseng H-C, Chang R-Y, Hsu C-H. Phenomenological improvements to predictive models of fiber orientation in concentrated suspensions. J Rheol 2013;57:1597-1631.

Foss PH, Tseng H-C, Snawerdt J, Chang Y-J, Yang W-H, Hsu C-H. Prediction of fiber orientation distribution in injection molded parts using moldex3d simulation. Polymer Composites 2014;35:671-680.

Wang J, O'Gara JF, Tucker III CL. An objective model for slow orientation kinetics in concentrated fiber suspensions: Theory and rheological evidence. J Rheol 2008;52:1179-1200.

Wang J, Nguyen BN, Mathur R, Sharma B, Sangid MD, Costa F, Jin X, Tucker III CL, Fifield LS. Fiber orientation in injection molded long carbon fiber thermoplastic composites. In: SPE ANTEC Conference, Technical Papers. Orlando, USA, May 1-5, 2015.

Nguyen BN, Fifield LS, Kijewski SA, Sangid MD, Wang J, Costa F, III CLT, Mathur RN, Gandhi UN, Mori S. Predictive engineering tools for injection-molded long-carbon-fiber thermoplastic composites—fy 2015 second quarterly report. the US Department of Energy, Pacific Northwest National Laboratory, PNNL Report under Contract DE-AC05-76RL01830 2015;PNNL-24259.

Tseng H-C, Chang R-Y, Hsu C-H. An objective tensor to predict anisotropic fiber orientation in concentrated suspensions. J Rheol 2016;60:215.

Rong-Yeu Chang, Wen-Hsien Yang. Numerical simulation of mold filling in injection molding using a three-dimensional finite volume approach. Int. J. Numer. Meth. Fluids 2001; 37: 125-148.

\* cited by examiner

MOLDING SYSTEM FOR PREPARING AN INJECTION MOLDED FIBER REINFORCED COMPOSITE ARTICLE

CROSS-REFERENCE TO RELATED APPLICATION

This patent application claims priority under 35 U.S.C. §119(e) from Provisional Patent Application No. 62/437,292, filed Dec. 21, 2016, the disclosure of which is incorporated by reference herein in its entirety, including all exhibits appended to Provisional Patent Application No. 62/437,292.

TECHNICAL FIELD

The present disclosure relates to a method for preparing a fiber-reinforced composite article using a computer-aided engineering (CAE) simulation.

DISCUSSION OF THE BACKGROUND

Fiber-reinforced thermoplastic (FRT) composites, produced by molding techniques, such as injection molding, greatly reduce assembly costs and vehicle weight. Use of FRTs to replace metals continues to show strong growth in automotive industrial products so as to improve specific mechanical properties, including tensile property, thermal expansion, electrical conductivity, and water penetrability. More importantly, these properties are strongly dependent on fiber orientation states. However, fiber orientation behavior regarding the plurality of fibers immersed in a polymeric matrix flowing through a filling mold of an injection process is very complex. Therefore, the model for describing orientation states of fibers is of great importance.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a method for preparing an injection-molded fiber-reinforced composite article using a molding machine controlled by a controlling module connected to the molding machine, comprising steps of: specifying a simulating domain corresponding to a genuine domain in a mold disposed on the molding machine, wherein the genuine domain has a mold cavity to be filled with a composite molding resin including a polymeric material having a plurality of fibers; performing a molding simulation executed on the controlling module to generate a shear rate distribution of the composite molding resin in the simulating domain while using a molding condition for the molding machine; generating an orientation distribution of the fibers in the composite molding resin executed on the controlling module by taking into consideration an effect of the shear rate on an inter-fiber interaction, or an effect of the shear rate on a response rate of the fibers; and controlling the molding machine with the controlling module using the molding condition to perform an actual molding for injecting the composite molding resin into at least a portion of the genuine domain.

Another aspect of the present disclosure provides a non-transitory computer medium containing computer instructions stored therein for causing a computer processor to perform operations for use in a molding process simulation, the operations comprising steps of: specifying a simulating domain corresponding to a genuine domain in a mold disposed on the molding machine, wherein the genuine domain has a mold cavity to be filled with a composite molding resin including a polymeric material having a plurality of fibers; performing a molding simulation to generate a shear rate distribution of the composite molding resin in the simulating domain while using a molding condition for the molding machine; and generating an orientation distribution of the fibers in the composite molding resin by taking into consideration an effect of the shear rate on an inter-fiber interaction, or an effect of the shear rate on a response rate of the fibers.

Another aspect of the present disclosure provides a molding system for preparing an injection-molded fiber-reinforced composite article, comprising: a mold having a mold cavity; a molding machine configured to fill the mold cavity with a composite molding resin including a polymeric material having a plurality of fibers; a computing apparatus connected to the molding machine, wherein the computing apparatus is programmed to generate a shear rate distribution of the composite molding resin in the mold cavity while using a molding condition for the molding machine, and to generate an orientation distribution of the fibers in the composite molding resin by taking into consideration an effect of the shear rate on an inter-fiber interaction or an effect of the shear rate on a response rate of the fibers; and a controller connected to the computing apparatus and configured to control the molding machine with the molding condition to perform an actual molding for injecting the composite molding resin into at least a portion of the mold cavity.

In some embodiments of the present disclosure, the orientation distribution is generated by taking into consideration a decrease of the inter-fiber interaction in response to an increase of the shear rate.

In some embodiments of the present disclosure, the effect of the shear rate on the inter-fiber interaction is represented by an expression:

$$C_I(\dot{\gamma}) = C_{I0}\left(1 + \frac{1-k_1}{1+(\dot{\gamma}/\dot{\gamma}_c)^{n_1}}\right)$$

$C_I(\dot{\gamma})$ represents the inter-fiber interaction, and $\dot{\gamma}$ represents the shear rate.

In some embodiments of the present disclosure, the orientation distribution is generated by taking into consideration a decrease of the response rate of the fibers in response to an increase of the shear rate.

In some embodiments of the present disclosure, the effect of the shear rate on the response rate of the fibers in the composite molding resin is represented using an expression:

$$\alpha(\dot{\gamma}) = \alpha_0\left(1 + \frac{1-k_2}{1+(\dot{\gamma}/\dot{\gamma}_c)^{n_2}}\right)$$

$\alpha(\dot{\gamma})$ represents a parameter for slowing down the response rate of the fibers, and $\dot{\gamma}$ represents the shear rate.

In some embodiments of the present disclosure, the parameter for slowing down the response rate of fibers represents a blocking effect of a matrix on a movement of the fiber, and the matrix includes the polymeric material and a boundary of the mold.

The mechanical property of the molded article is correlated with the orientation distribution of the fibers. If the simulated orientation distribution of the fibers with the corresponding mechanical property does not meet the specification of the molded FRT article, the fiber parameters or the molding condition may be adjusted, and another simulation is performed to obtain an updated orientation distribution of the fibers in the composite molding resin while using the adjusted fiber parameter or the molding condition. To obtain the orientation distribution of the fibers in the composite molding resin injected into the mold cavity, the present disclosure takes into consideration the effect of the shear rate on an inter-fiber interaction or the effect of the shear rate on a response rate of the fibers, i.e., using shear-rate-dependent parameters to physically model the effects of the shear rate on the inter-fiber interaction and the response rate of the fibers. Consequently, the present disclosure can accurately predict the orientation distribution of the fibers in the composite molding resin and the mechanical property of the molded FRT article.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
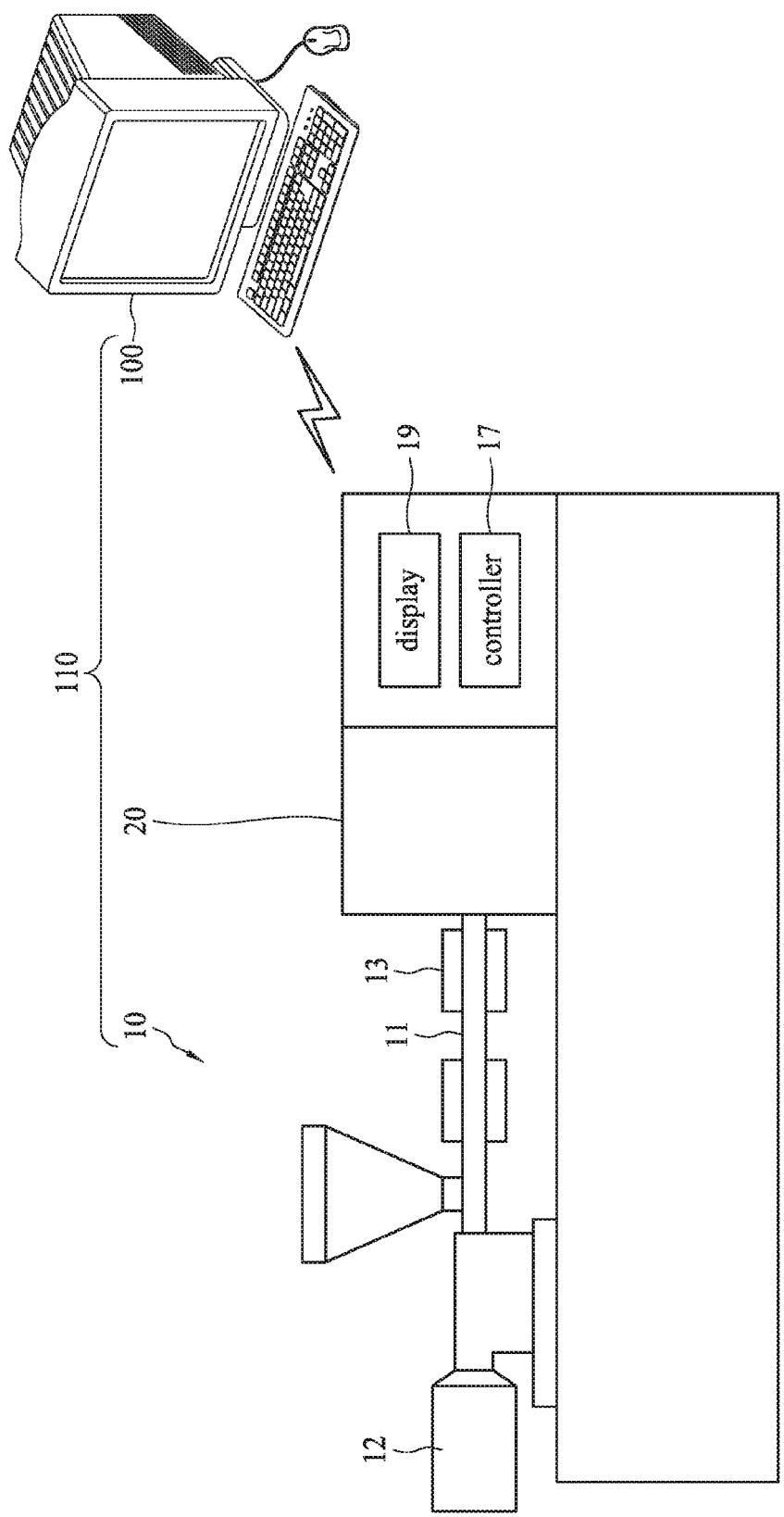
FIG. 1 is a schematic view of an injection molding system in accordance with various embodiments of the present disclosure.

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

The present disclosure is directed to a method for preparing a fiber-reinforced composite article using a computer-aided engineering (CAE) simulation. In order to make the present disclosure completely comprehensible, detailed steps and structures are provided in the following description. Obviously, implementation of the present disclosure does not limit special details known by persons skilled in the art. In addition, known structures and steps are not described in detail, so as not to limit the present disclosure unnecessarily. Preferred embodiments of the present disclosure will be described below in detail. However, in addition to the detailed description, the present disclosure may also be widely implemented in other embodiments. The scope of the present disclosure is not limited to the detailed description, and is defined by the claims.

Injection molding is a technology commonly used for high-volume manufacturing of parts made of synthetic resin, most commonly made of thermoplastic polymers. During a repetitive injection molding process, a plastic resin, most often in the form of small beads or pellets, is introduced to an injection molding machine that melts the resin beads under heat, pressure, and shear. The now molten resin is forcefully injected into a mold cavity having a particular cavity shape. The injected plastic is held under pressure in the mold cavity, cooled, and then removed as a solidified part having a shape that essentially duplicates the cavity shape of the mold.

A typical injection molding procedure comprises four basic operations: (1) heating the plastic resin in the injection molding machine to allow it to flow under pressure; (2) injecting the melted plastic resin into a mold cavity or cavities defined between two mold halves that have been closed; (3) allowing the plastic resin to cool and harden in the cavity or cavities while under pressure; and (4) opening the mold halves to cause the cooled part to be ejected from the mold. In the conventional injection molding of synthetic resin by an injection molding machine, the weight of the injected synthetic resin varies with the molten resin pressure, the molten resin specific volume, the molten resin temperature or other molten resin conditions. Therefore, it is difficult to form products of a consistent quality.

In general, the setting of molding conditions of the injection molding machine requires a large number of trial molding operations and a long setting time because the setting work greatly depends on the know-how and experience of an operator of the injection molding machine, and various physical values affect one another as well.

Therefore, a virtual molding, i.e., computer-implemented simulation, by use of CAE (Computer-Assisted Engineering) is performed for the injection molding, and the molding conditions are then set based on the virtual molding. In virtual molding by use of CAE, phenomena will occur in a mold cavity within a short period of time, i.e., the result of simulation on resin temperature, pressure, shear rate, etc. can be reflected in molded products. Therefore, if the molding phenomena occurring within a mold cavity can be accurately predicted, use of CAE may enable optimization of molding conditions and stable molding of non-defective products.

Figure 2:
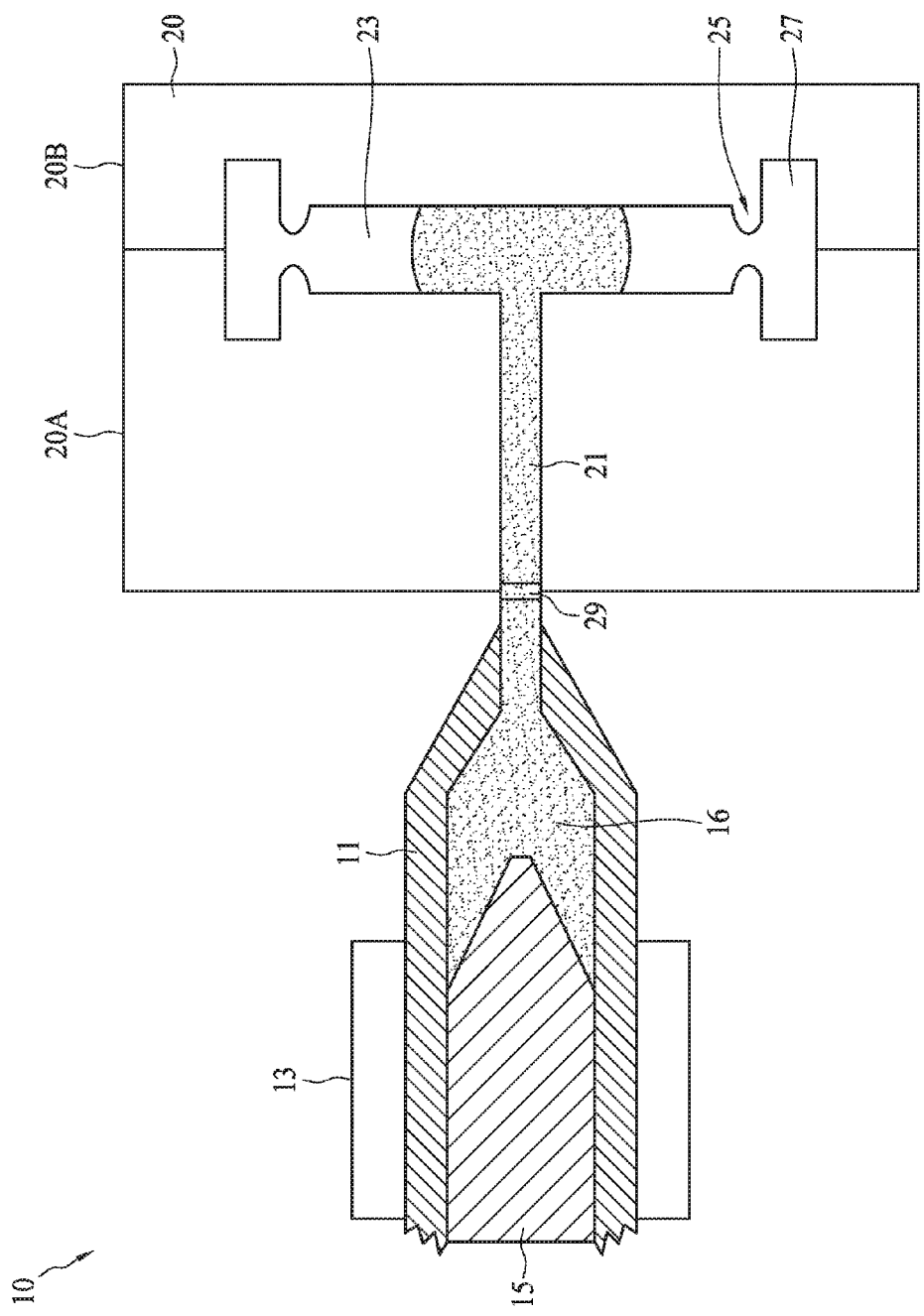
FIG. 2 is a close-up schematic view of the mold in FIG. 1.

FIG. 1 is a schematic view of an injection molding system 110 in accordance with various embodiments of the present disclosure, and FIG. 2 is a close-up schematic view of the mold 20 and the barrel 11 in FIG. 1. The injection molding system 110 comprises a molding machine 10 such as an injection molding machine, a mold 20 disposed on the molding machine 10, and a computing apparatus 100 connected to the injection molding machine 10. In some embodiments of the present disclosure, the injection molding machine 10 includes a screw chamber 11, heating elements 13 configured to heat the screw chamber 11, and a screw 15 positioned in the screw chamber 11 and driven by a screw-driving motor 12 for feeding a molding resin 16, such as thermoplastics, into a mold cavity 27 of the metal mold 20. In some embodiments of the present disclosure, the injection molding system 110 has a controller 17 configured to control the operation of the injection molding machine 10, and a display 19 configured to display information of the injection molding process. In some embodiments of the present disclosure, the controller 17 and the computing apparatus 100 implement a controlling module of the injection molding system 110.

In some embodiments of the present disclosure, the injection molding machine 10 is equipped with sensors for sensing the velocity of the screw 15, the pressure of the barrel 11 (the filling pressure in the filling stage and the packing pressure in the packing stage) and the temperature of the barrel 11 (the filling temperature in the filling stage and the packing temperature in the packing stage); and the computing apparatus 100 is programmed to acquire the velocity and pressure data from the controller 17 through the association therebetween.

The metal mold 20 is constituted by a fixed-side metal mold 20A and a movable-side metal mold 20B. Inside the metal mold 20, a sprue portion 21, a runner portion 23, a gate portion 25 and a mold cavity 27 are formed so as to be arranged in the above-mentioned order from the injection molding machine 10. The sprue portion 21 of the metal mold 20 is connected to the barrel 11 of the molding machine 10 via a nozzle 29.

The injection molding technique uses conventional rapid automated molding equipment, and SFRT/LFRT production is applied using the injection process. In the injection molding process, the additional fiber-filled polymer/resin melts (fibers in a matrix) are transported as a suspension into the mold cavity 27. To design molded FRT articles effectively, the influence of flow-induced fiber orientation distribution on the mechanical properties of the finished molding product, such as the strength of the finished molding product, must be considered.

FRT composites are generally grouped into two categories based on fiber length: short fiber-reinforced thermoplastics or SFRTs, with fiber length less than 1.0 mm, and long fiber-reinforced thermoplastics or LFRTs, having fiber length greater than 1.0 mm. Unlike SFRTs, LFRTs can yield continuous-fiber reinforcement. LFRT pellets are more extensively employed in automotive industrial fabrication than SFRT pellets.

Figure 3:
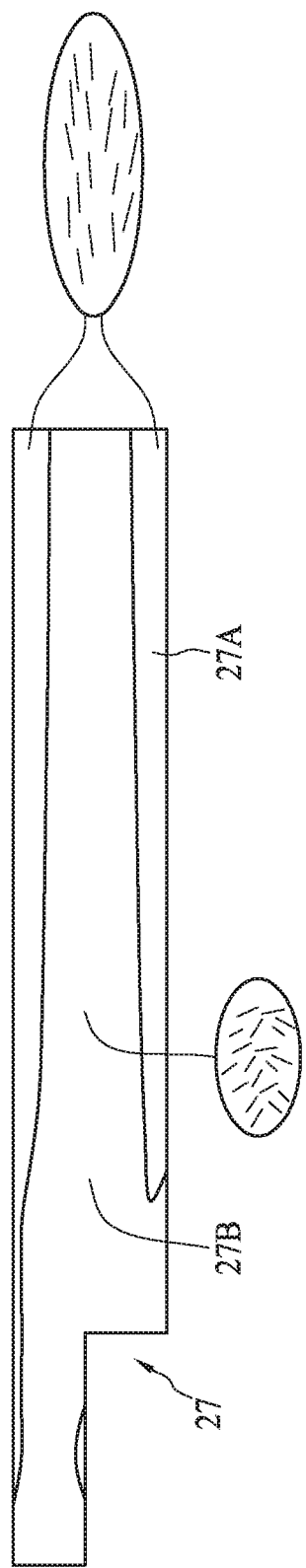
FIG. 3 illustrates the orientation of the fibers filled into the mold cavity 27 in FIG. 2.

FIG. 3 illustrates the orientation of a composite molding resin (including a polymeric material having a plurality of fibers) filled into the mold cavity 27 in FIG. 2. The most noticeable feature of the filling is the existence of shell layers 27A and a core region 27B across the thickness of the molded cavity 27. The fibers found in the shell layers 27A (near the cavity wall) are strongly aligned in the flow direction, but the fibers in the core region 27B (near the cavity center) are transverse to the flow. Hence, it is necessary to understand how the fiber orientation varies during the mold filling and the subsequent packing stages. In some embodiments of the present disclosure, the polymeric material is PP (Polypropylene), PBT (Polybutylene terephthalate), nylon, or PC (Polycarbonate), the fibers are glass fibers or carbon fiber, and the fiber concentration in the polymeric material is between 10 wt % and 60 wt %.

Figure 4:
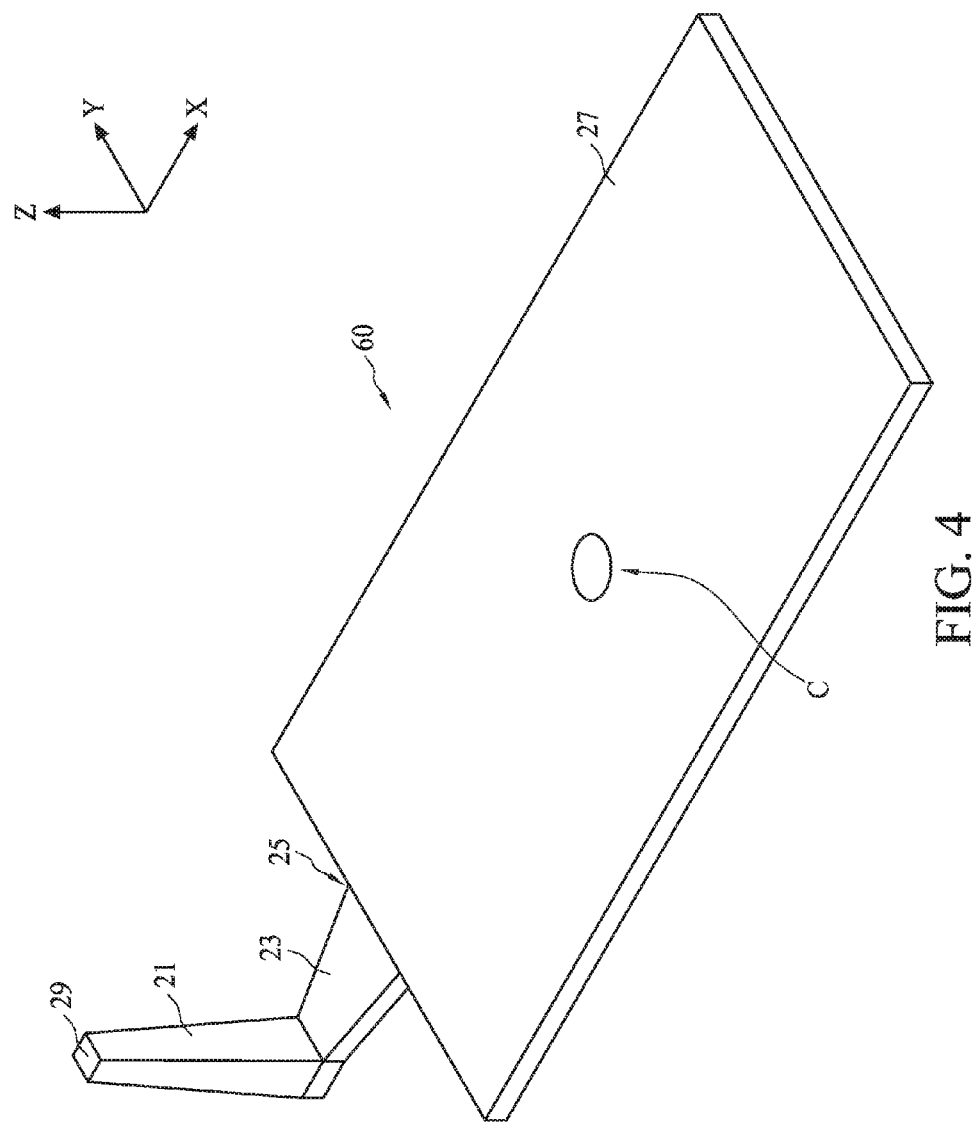
FIG. 4 shows a genuine domain of an FRT composite article with a fan-gated plaque geometry having a marked region C at the center.
Figure 5:
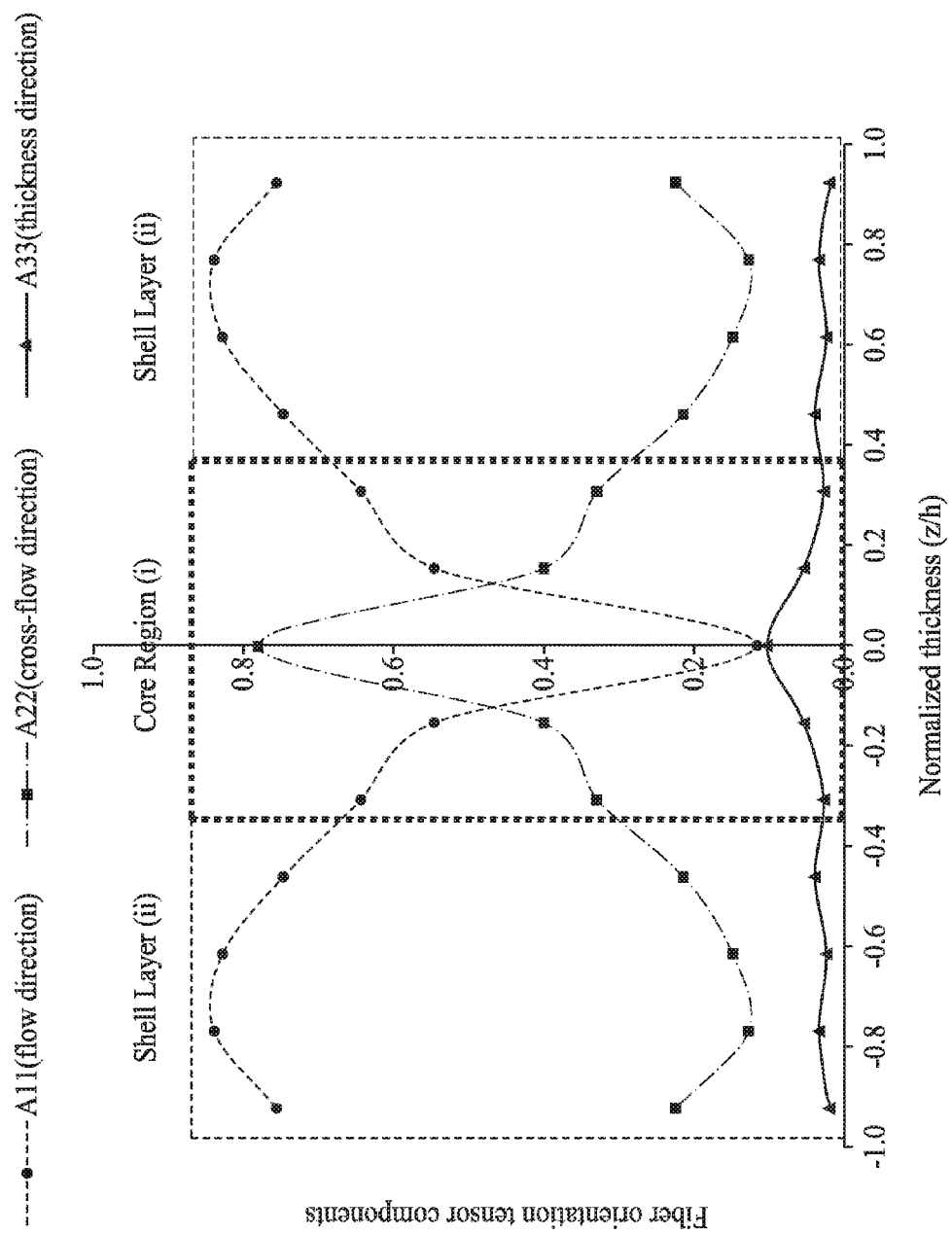
FIG. 5 shows a well-known shell-core structure of fiber orientation across the thickness of the molded FRT article at the region C shown in FIG. 4.

FIG. 4 shows a genuine domain 60 of an FRT composite article with a fan-gated plaque geometry, and FIG. 5 shows a fiber orientation distribution of the FRT composite article in FIG. 4. As clearly shown in FIG. 5, the fiber orientation distribution across the thickness of the FRT composite article at a marked site (the center of the plaque) shows a well-known shell-core structure. Micro-computer tomography is a non-destructive testing method to obtain the digital data of fiber orientation tensor components as a function of the layer thickness. The orientation tensor components include the flow-direction (x-axis) orientation tensor component A11, the cross-flow-direction (y-axis) orientation component A22, and the thickness-direction (z-axis) orientation component A33. The shell layers and the core region of the fiber orientation distribution for the FRT composite article include three significant features: (i) in the shell layers, both A11 and A22 curves are almost parallel with higher A11 values and lower A22 values; (ii) over the core region, the A11 and A22 curves obviously cross, with lower A11 values and higher A22 values; (iii) the A33 value remains low.

Theoretical researches of fiber orientations are significant in the field of suspension rheology. The classical hydrodynamic model for a single axisymmetric fiber was proposed by the pioneer Jeffery. Folgar and Tucker modified Jeffery's model to include fiber-fiber interactions in semi-concentrated suspensions, which has been widely used to predict flow-induced fiber orientation patterns in injection-molded FRT articles. Recently, it is significant that both objective models of fiber orientation were developed in the field of suspension rheology, namely, RSC (Reduced Strain Closure) and iARD-RPR (Improved Anisotropic Rotary Diffusion and Retarding Principal Rate). The state-of-the-art predictive engineering tools of injection molding simulations, the Autodesk Simulation Moldflow Insight (ASMI) and the Moldex3D (CoreTech System Co. of Taiwan), have incorporated the RSC model and the iARD-RPR model, respectively, to provide predictions of fiber orientation.

Accurate orientation predictions of the modern RSC and iARD-RPR models are primary requirements in a complete simulation, from injection molding to structural analysis. However, some studies have found the weakness and flaw of RSC and iARD-RPR in which significant deviation was found in the core region, although the orientation in the shell layer was predicted fairly well. This is a long-running problem in the state-of-the-art predictive engineering tools.

Regarding this issue, an ASMI team provided an available function, "the 3D inlet condition of fiber orientation set around a gate area," to improve fiber orientation predictions using the RSC model in 3D-mesh analysis. Wang, et al. and Nguyen, et al. examined a new research version of the ASMI Fiber solver with the 3D inlet gate condition of fiber orientation distribution, supporting the user-defined model (if possessing experimental data) and the specified model (artificially, to define aligned orientation at the skin and transverse/random orientation at the core). It is noteworthy that they pointed out that the inlet condition strongly influences the prediction of the RSC model and the ARD-RSC model. Therefore, the good orientation predictions of long carbon fibers were achieved by comparing the midplane-mesh and 3D-mesh simulations with relevant experimental data.

Figure 6:
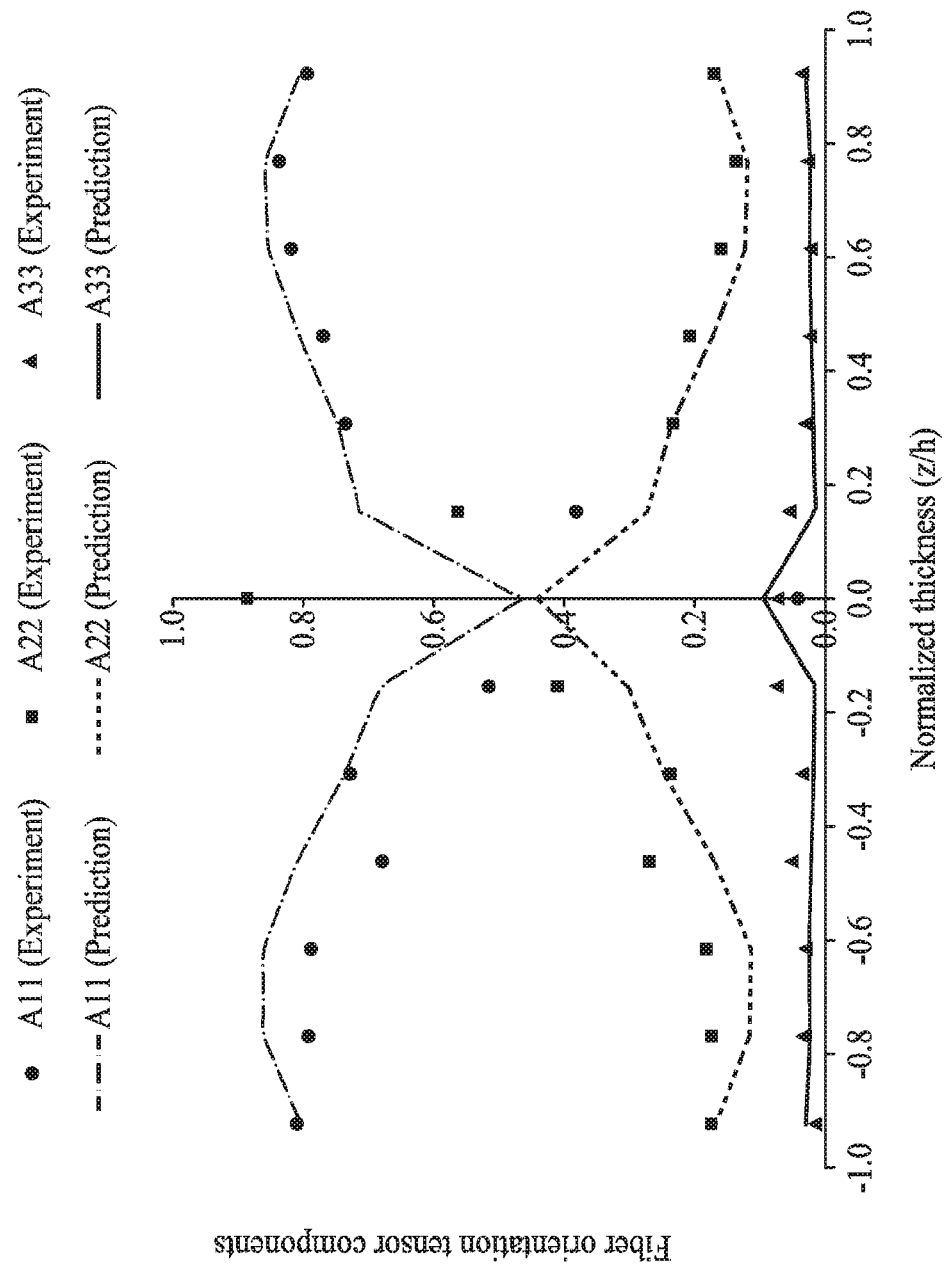
FIG. 6 shows the experimental and predicted fiber orientation distributions across the normalized thickness of the molded FRT article at marked region C in FIG. 4.

FIG. 6 shows the experimental and predicted fiber orientation distributions across the thickness of the FRT article at the marked region C (the center of the plaque) in FIG. 4. FIG. 6 is disclosed by Foss, et al. to validate the accuracy of short glass-fiber orientation predictions in an injection molded plaque, wherein the composite molding resin is 30 wt % glass-fiber filled polybutylene-terephthalate (30 wt % GF/PBT). However, their result indicated that the orientation in the shell layer was predicted fairly well, while significant deviation was found in the core region (FIG. 6). Over the core region, it is obvious to find the over-predicted A11 value and the under-predicted A22 value.

Recently, the inventors of the present disclosure proposed an iARD-RPR model including three parts (See, U.S. Pat. No. 8,571,828; H.-C. Tseng, R.-Y. Chang, C.-H. Hsu, Phenomenological improvements to predictive models of fiber orientation in concentrated suspensions, J. Rheol., 57 (2013) 1597; H.-C. Tseng, R.-Y. Chang, C.-H. Hsu, An objective tensor to predict anisotropic fiber orientation in concentrated suspensions, J. Rheol., 60 (2016) 215; the entirety of which are incorporated herein by reference).

First, the iARD-RPR equation contains three terms: the Jeffery Hydrodynamics (HD) $\dot{A}^{HD}$, the iARD $\dot{A}^{iARD}$, and the RPR $\dot{A}^{RPR}$, presented as follows:

$$\dot{A} = \dot{A}^{HD} + \dot{A}^{iARD}(C_I, C_M) + \dot{A}^{RPR}(\alpha) \tag{1}$$

$$\dot{A}^{HD} = (W \cdot A - A \cdot W) + \xi(D \cdot A + A \cdot D - 2A_4 : D) \tag{2}$$

A is the second order orientation tensor, $A_4$ is a fourth order orientation tensor, W is the vorticity tensor, D is the rate-of-deformation tensor, $\xi$ is the shape factor, and $a_r$ is the fiber aspect ratio, i.e., the ratio of fiber length l to fiber diameter d, $a_r = l/d$.

$\dot{A}^{iARD}(C_I, C_M)$ has two parameters: the fiber-fiber interaction parameter $C_I$ and the fiber-matrix interaction parameter $C_M$; $\dot{A}^{RPR}(\alpha)$ has one parameter $\alpha$, which is meant to slow down a quicker response rate of the fiber movement.

Second, it is significant that the rotary diffusion tensor $D_r$ depends on the square of the objective rate-of-deformation tensor for defining a new iARD model, as below:

$$\dot{A}^{iARD} = \dot{\gamma}[2D_r - 2tr(D_r)A - 5D_r \cdot A - 5A \cdot D_r + 10A_4 : D_r] \tag{3}$$

$$D_r = C_I\left(I - C_M \frac{D^2}{\|D^2\|}\right) \tag{4}$$

D is the symmetric part of the velocity-gradient tensor L, $$D = \frac{1}{2}(L^T + L).$$

The scalar $$\|D^2\| = \sqrt{\frac{1}{2}D^2 : D^2}$$

is the norm of tensor $D^2$.

Lastly, the RPR model is introduced as:

$$\dot{A}^{RPR} = -R \cdot \dot{\Lambda}^{IOK} \cdot R^T \tag{5}$$

$$\dot{\Lambda}_{ij}^{IOK} = \alpha \dot{\lambda}_i, \, i,j,k=1,2,3 \tag{6}$$

Where $\dot{\Lambda}^{IOK}$ is the material derivative of a particular diagonal tensor and its superscript indicates the intrinsic orientation kinetics (IOK) assumption; R is the rotation matrix and $R^T$ is the transpose of R; the superscript T is the transpose operator of a matrix throughout this paper; $\lambda_i$ is the eigenvalues of A, $\lambda_1 \geq \lambda_2 \geq \lambda_3$; and $R=[e_1, e_2, e_3]$ is defined by eigenvector columns of A.

The iARD-RPR model has the three physical parameters: a fiber-fiber interaction (inter-fiber interaction) parameter $C_I$, a fiber-matrix interaction parameter $C_M$, and a slow-down parameter $\alpha$. The available numerical region of these three parameters is suggested in: $0<C_I<0.1$, $0<C_M<1$, $0<\alpha<1$. In addition, the fiber orientation of the shell layer depends on the iARD parameters ($C_I$ and $C_M$), while the core width is controlled by the RPR parameter ($\alpha$). For short fibers, the default parameters are suggested: $C_I=0.005$, $C_M=0.1$, $\alpha=0.7$; for long fibers is given: $C_I=0.01$, $C_M=1.0$, $\alpha=0.1$.

The iARD-RPR model has been implemented in the commercial injection molding simulation software, Moldex3D (CoreTech System Co. of Taiwan), to allow for the fiber orientation predictions. In addition, the initial condition of the fiber orientation tensor at the runner entrance was set as the isotropic state. An experimental inlet condition did not need to be set around a gate, due to the higher 3D numerical resolution and the solid runner system consideration in computation.

In practice, the fiber orientation is strongly influenced by flow field of shear rate, namely, the so-called shear-induced fiber orientation. Here, the present disclosure therefore proposes that the iARD-RPR parameters, $C_I$ and α, depend on shear rate. Physically, parameter $C_I$ indicates degree of collision/interaction between fiber and fiber. A greater $C_I$ value yields a lower degree of fiber orientation, and vice versa. When shear rate is increased, degree of fiber orientation along flow direction is increased wherein $C_I$ approaches a smaller value. Thus, at low shear rates, there occur lower orientation degrees and greater $C_I$ values. In addition, when the shear rate is increased or decreased to a certain critical value $\dot{\gamma}_c$, the $C_I$ value remains almost unchanged with respect to the shear rate.

According to the physical logic analysis above, a physical model, shear-rate dependent ($C_I$), is proposed as follows:

$$C_I(\dot{\gamma}) = C_{I0}\left(1 + \frac{1-k_1}{1+(\dot{\gamma}/\dot{\gamma}_c)^{n_1}}\right) \quad (7)$$

Figure 7:
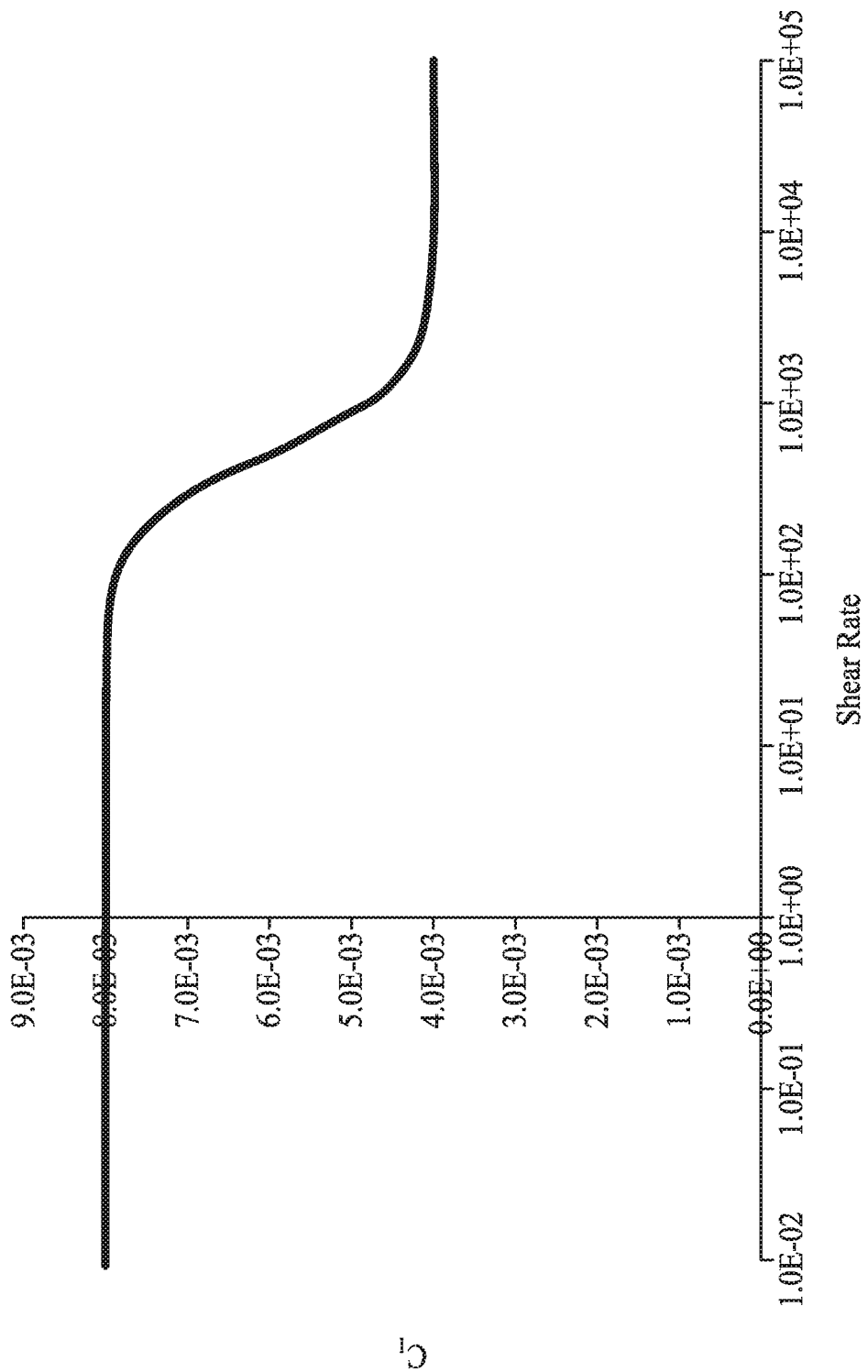
FIG. 7 shows the variation of the fiber-fiber interaction parameter with respect to the shear rate of the composite molding resin at marked region C in FIG. 4.

The following parameters are set: $C_{I0}$=0.008, $n_1$=−2, $k_1$=0.5, $\dot{\gamma}_c$=500; thus, the $C_I$ against shear rate is plotted in FIG. 7.

The RPR parameter (α) serves to slow down the response rate of the fiber movements due to a reliable fiber-matrix interaction (a blocking effect of the matrix including polymeric material and boundary of the mold) on the fiber motion, in particular, rotation; the larger α indicates resulting a very slow rate of fiber movement. At high shear rates, fiber orientation response should be significantly slowed with the larger α value. At low shear rates, the response is not slowed with smaller α value. In addition, the shear rate is increased or decreased to a certain critical value $\dot{\gamma}_c$, where the α value remains almost unchanged with respect to the shear rate.

According to the physical logic above, a mathematical model, shear-rate dependent α, is proposed as follows:

$$\alpha(\dot{\gamma}) = \alpha_0\left(1 + \frac{1-k_2}{1+(\dot{\gamma}/\dot{\gamma}_c)^{n_2}}\right) \quad (8)$$

Figure 8:
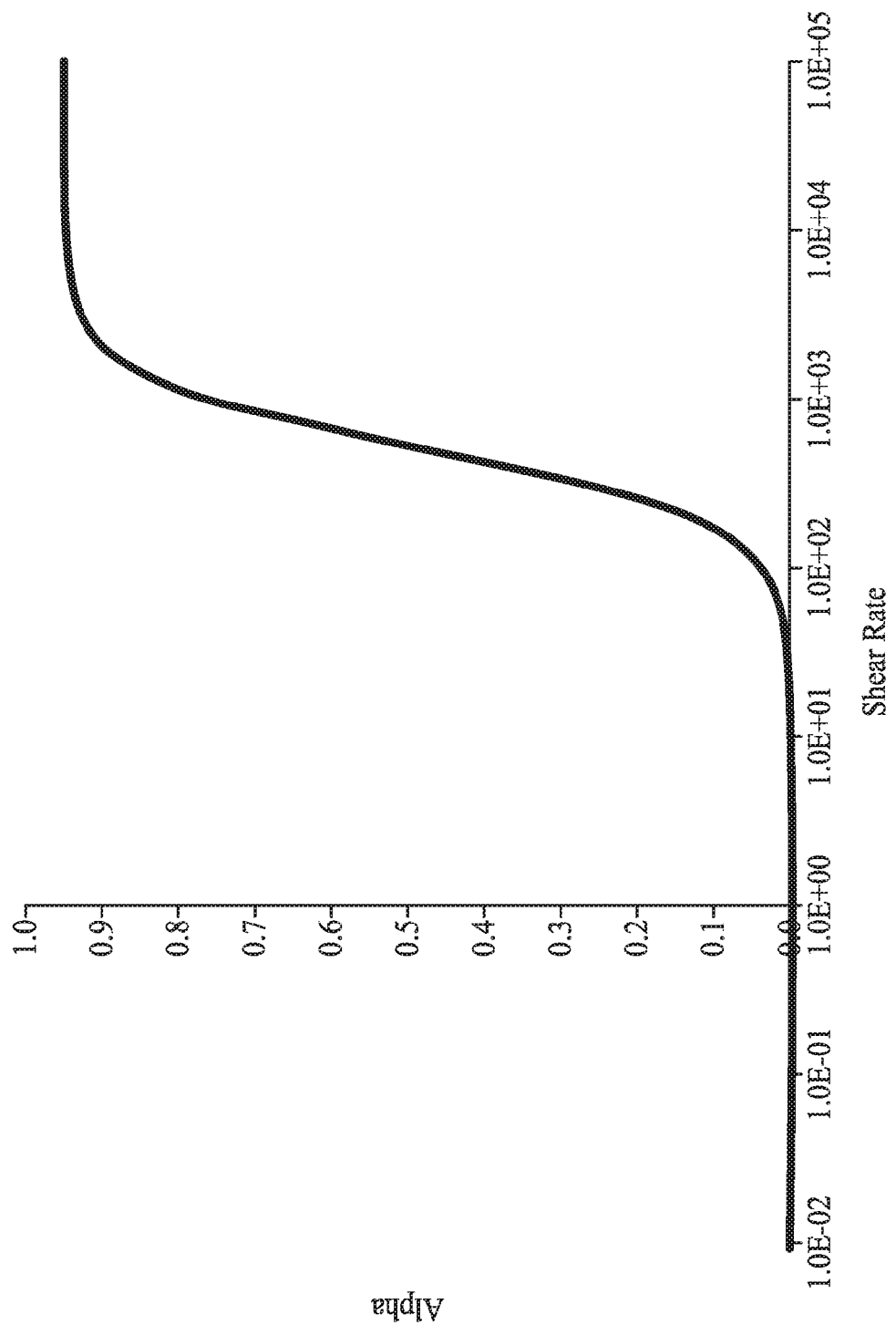
FIG. 8 shows the variation of the parameter for slowing down the response rate of fibers with respect to the shear rate of the composite molding resin at marked region C in FIG. 4.

The following parameters are set: $\alpha_0$=0.95, $n_2$=2, $k_2$=0, $\dot{\gamma}_c$=500; thus, α is plotted against shear rate in FIG. 8.

Figure 9:
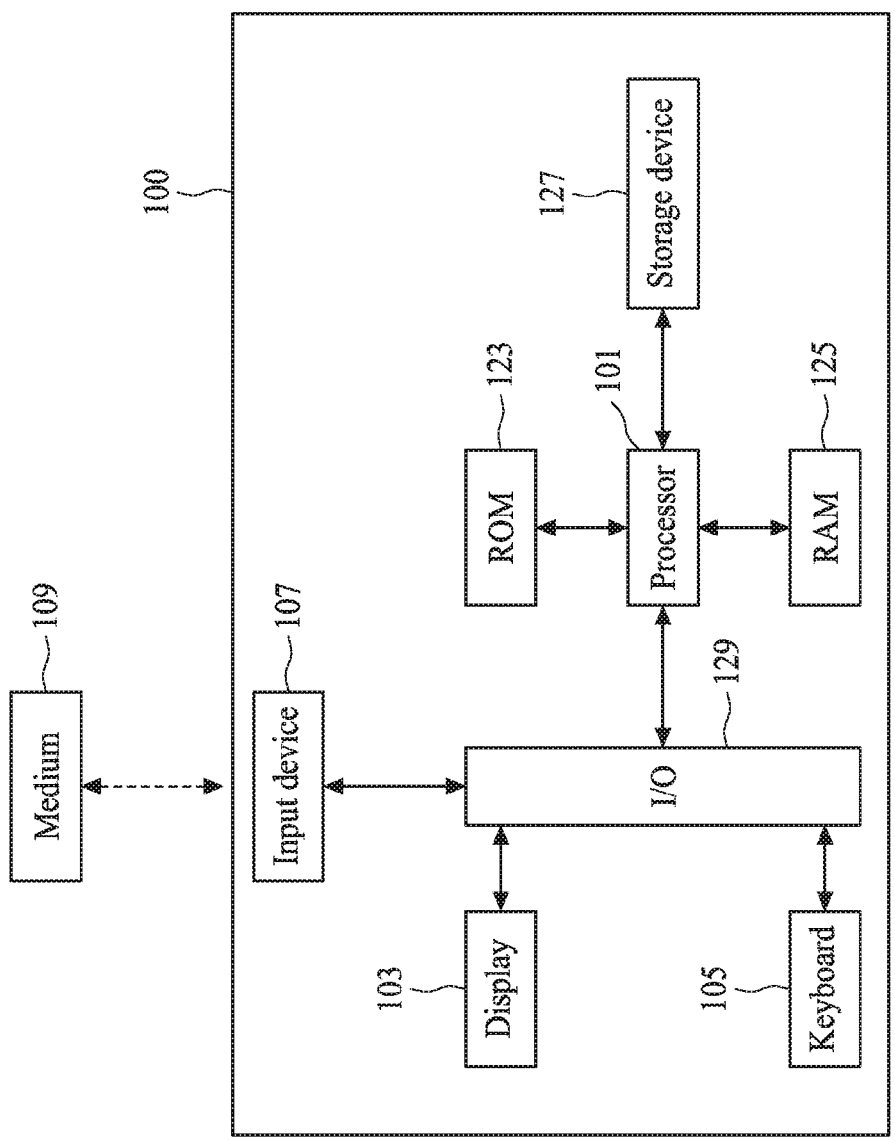
FIG. 9 is a functional block diagram of a computing apparatus in accordance with some embodiments of the present disclosure.

FIG. 9 is a functional block diagram of the computing apparatus 100 in accordance with some embodiments of the present disclosure. In some embodiments of the present disclosure, the computing apparatus 100 comprises a computer processor 101 for performing a computer-implemented injection molding method. In some embodiments of the present disclosure, the computing apparatus 100 includes a read-only memory (ROM) 123, a random access memory (RAM) 125, a storage device 127, and an input/output (I/O) interface 129. The computer processor 101 operably communicates with the ROM 123, the RAM 125, the storage device 127, and the I/O interface 129.

In some embodiments of the present disclosure, the computing apparatus 100 may further include a display 103, a keyboard 105, and an input device 107, such as a card reader or an optical disk drive. The input device 107 is configured to input computer instructions (software algorithms) stored in a non-transitory computer-readable medium 109, and the computer processor 101 is configured to execute operations for performing a computer-implemented injection molding simulation method according to the computer instructions. The computer processor 101 reads software algorithms from the input device 107 or the storage device 127, executes the calculation steps, and stores the calculated result in the RAM 125. In some embodiments of the present disclosure, the memory devices, i.e., the ROM 123 and the RAM 125, can be programmed to store codes for performing the computer-implemented method.

Figure 10:
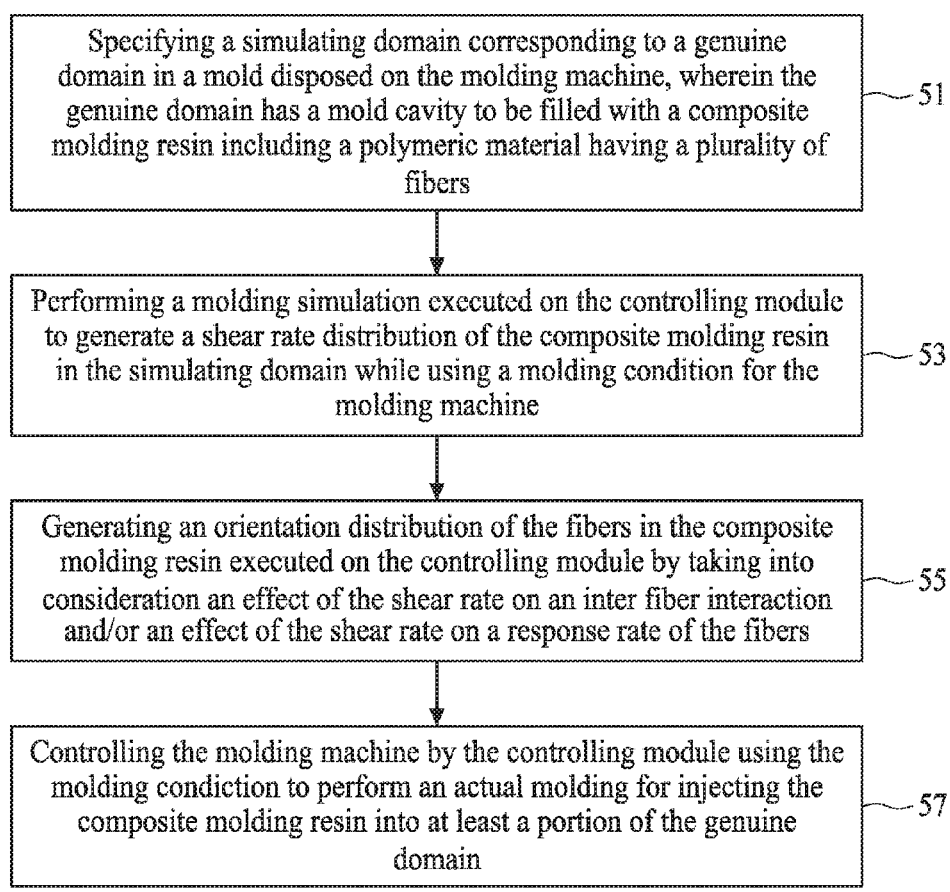
FIG. 10 is a flow chart of the method for preparing an injection-molded fiber-reinforced composite article using a molding machine controlled by a controlling module in accordance with some embodiments of the present disclosure.

FIG. 10 is a flow chart of the method 50 for preparing an injection-molded fiber-reinforced composite article using a molding machine controlled by a controlling module connected to the molding machine in accordance with some embodiments of the present disclosure. The method comprises a step 51 of specifying a simulating domain corresponding to a genuine domain in a mold disposed on the molding machine, wherein the genuine domain has a mold cavity to be filled with the composite molding resin including a polymeric material having a plurality of fibers; a step 53 of performing a molding simulation executed on the controlling module to generate a shear rate distribution of the composite molding resin in the simulating domain while using a molding condition for the molding machine; a step 55 of calculating a fiber orientation distribution executed on the controlling module to generate a fiber orientation distribution of the fibers in the simulating domain by taking into consideration an effect of the shear rate on an inter-fiber interaction in the composite molding resin or an effect of the shear rate on a response rate of the fiber in the composite molding resin; and a step 57 of controlling the molding machine by the controlling module using the molding condition to perform an actual molding for injecting the composite molding resin into at least a portion of the genuine domain.

In some embodiments of the present disclosure, the method 50 can begin with the step 51 where the simulating domain is specified. In some embodiments of the present disclosure, the simulating domain is obtained from a CAD (Computer Aided Design) model used in design and development of a molding product.

Referring back to FIG. 2, the metal mold 20 may be divided into two parts: a metal part and a space part defined by the metal part. The genuine domain 60 in FIG. 4 is an example of the space part of the metal mold 20. In some embodiments of the present disclosure, the method 30 can begin with the step 31 where a simulating domain is specified. In some embodiments of the present disclosure, the simulating domain is obtained from a CAD (Computer Aided Design) model used in design and development of a product.

Figure 11:
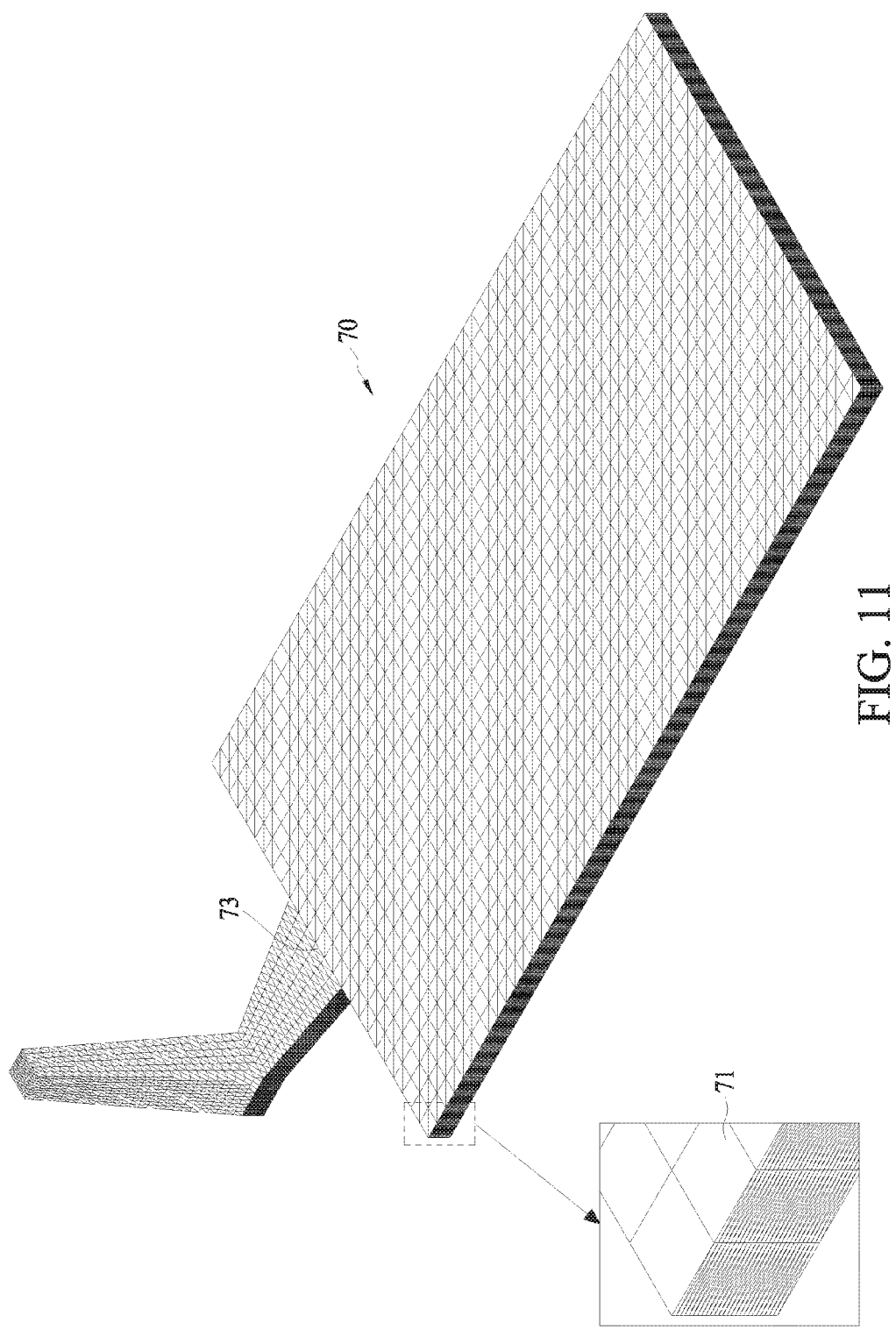
FIG. 11 is a schematic view of a simulating domain corresponding to the genuine domain in accordance with some embodiments of the present disclosure.

FIG. 11 is a schematic view of a simulating domain 70 corresponding to the genuine domain 60 in accordance with some embodiments of the present disclosure. In some embodiments of the present disclosure, a mesh is created by dividing at least part of the simulating domain 70 before actually applying a numerical analysis, such as an FEM (finite element method), an FDM (finite difference method) or an FVM (finite volume method), to the simulating domain 70. The creation of the mesh for the simulating domain 70 uses a technique of modeling an object or fluid (composite molding resin) region (i.e., the simulating domain 70 of the present embodiment) to be analyzed with a set of elements 71, such as rectangular mesh, hexahedral mesh or tetrahedral mesh, in order to perform the subsequent numerical analysis.

In step 53, to generate a shear rate distribution of the composite molding resin, a virtual molding process is performed to simulate a molding process of the composite molding resin that is injected into the simulating domain 70 while using a molding condition for the molding machine, wherein the molding condition includes the mold temperature, resin temperature, injection pressure, injection time (or speed), packing pressure, packing time, etc. The molding phenomena of the molding material 16 can be simulated using the following governing equations (9)-(12):

$$\frac{\partial \rho}{\partial t} + \nabla \cdot \rho u = 0 \quad (9)$$

$$\frac{\partial}{\partial t}(\rho u) + \nabla \cdot (\rho u u + \tau) = -\nabla p + \rho g \quad (10)$$

$$\frac{\partial}{\partial t}(T\rho C_p) + \nabla \cdot (\rho u C_p T) = k\nabla^2 T + \eta \dot{\gamma}^2 \quad (11)$$

$$\tau = -\eta(T, \dot{\gamma})(\nabla u + \nabla u^T) \quad (12)$$

where $\rho$ represents the density, t represents the time, u represents the velocity vector (flow velocity), $\tau$ represents the total stress tensor, p represents the pressure, g represents the gravity vector, T represents the temperature, $C_p$ represents the specific heat, k represents the thermal conductivity, $\eta$ represents the viscosity, and $\dot{\gamma}$ represents the shear rate.

Solving the governing equations (9)-(12) require a transient state analysis, which can be performed numerically using a computer. See, for example, Rong-yeu Chang and Wen-hsien Yang, "Numerical simulation of mold filling in injection molding using a three-dimensional finite volume approach", International Journal for Numerical Methods in Fluids Volume 37, Issue 2, pages 125-148, Sep. 30, 2001, the entirety of which is incorporated herein by reference. During the transient state analysis, the process variables that change with time are not zero; i.e., the partial derivatives ($\partial/\partial t$) in the governing equations (9)-(12) are not considered zero.

Figure 12:
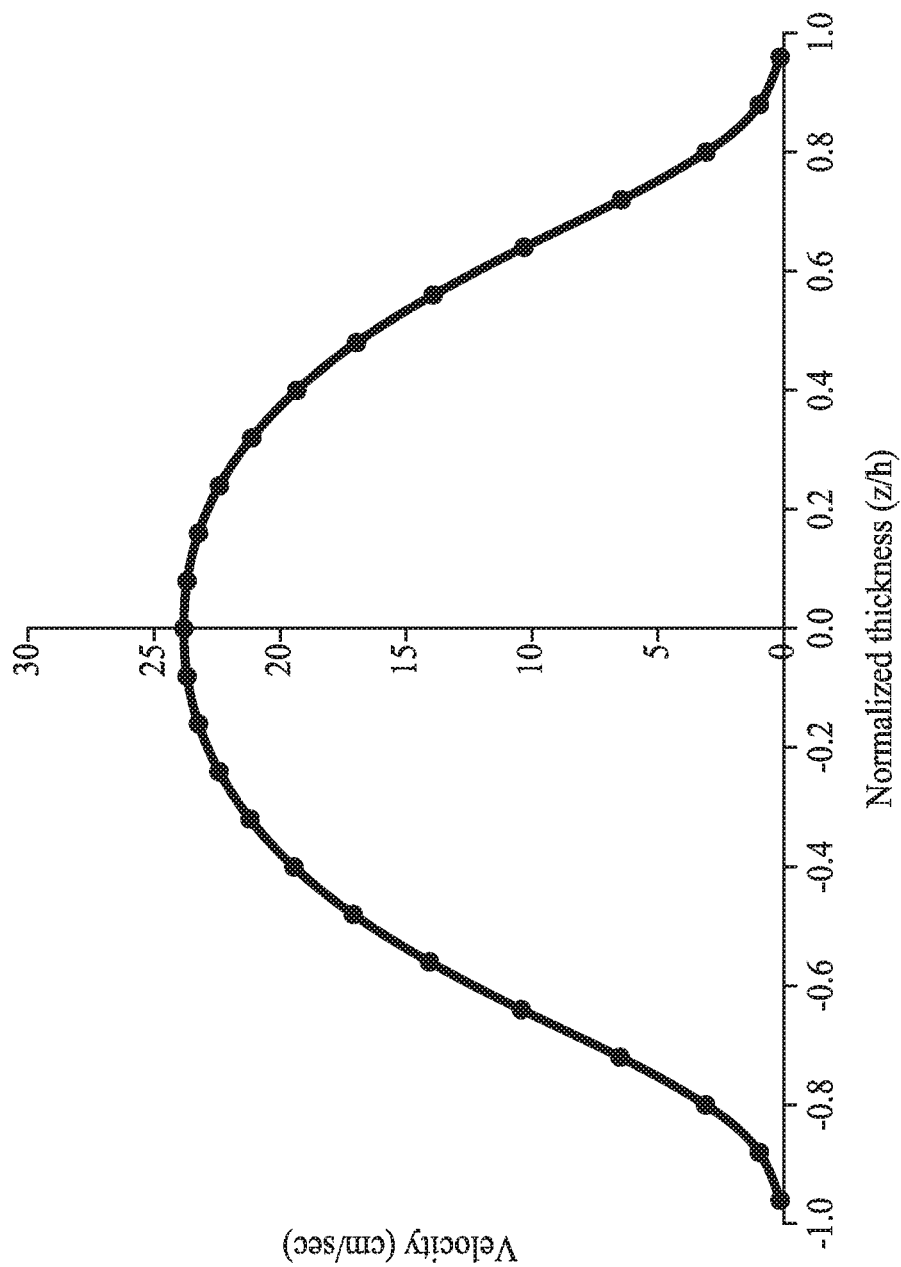
FIG. 12 shows the velocity profile of the fluid with the fibers injected into the simulating domain across the normalized thickness (z/h) from the transient state analysis in accordance with some embodiments of the present disclosure.
Figure 13:
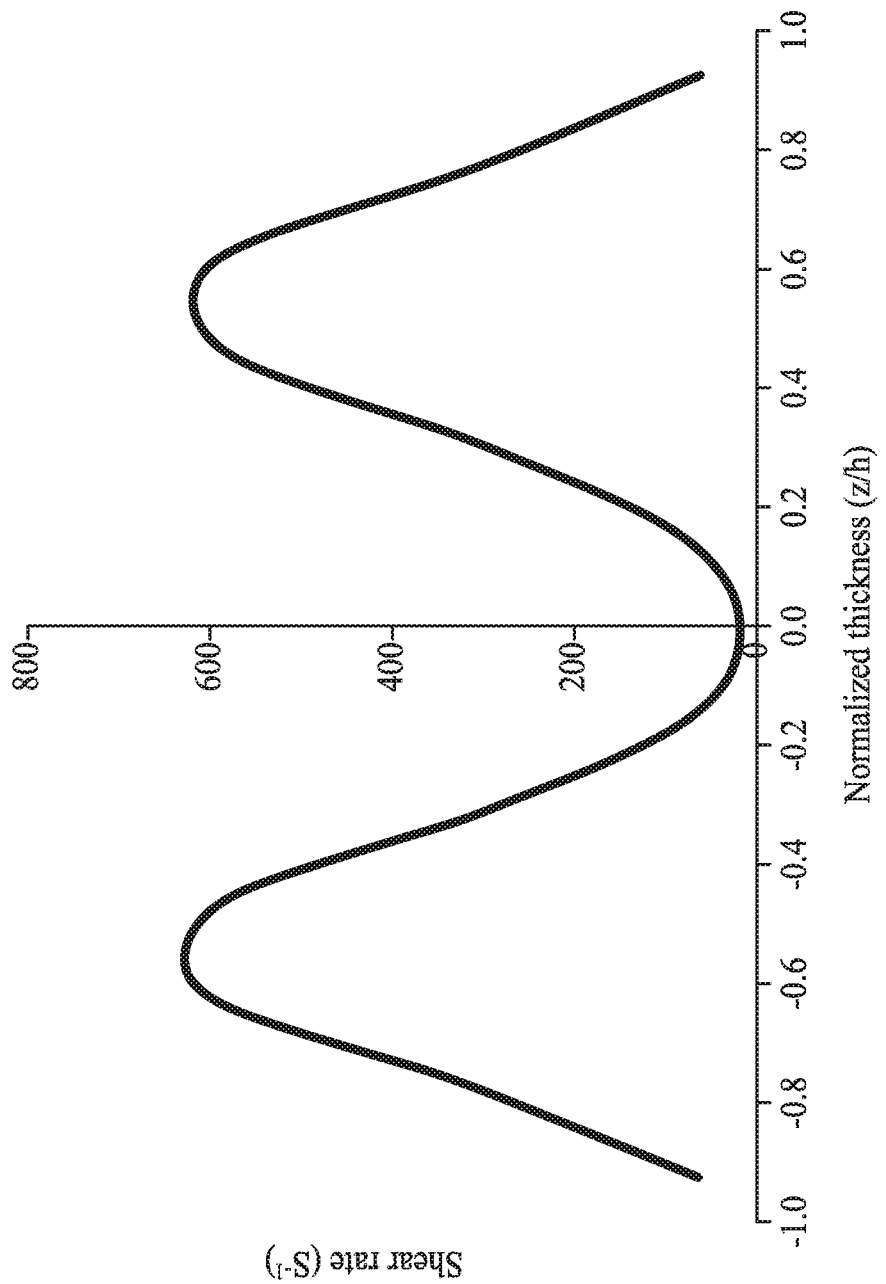
FIG. 13 shows the shear rate profile of the fluid with the fibers injected into the simulating domain through the normalized thickness from FIG. 12.

FIG. 12 shows the velocity profile of the fluid (composite molding resin) injected into the simulating domain 70 across the normalized thickness (z/h) from the transient state analysis in accordance with some embodiments of the present disclosure, and FIG. 13 shows the shear rate profile of the fluid (composite molding resin) injected into the simulating domain 70 across the normalized thickness from FIG. 12. The velocity profile and the shear rate profile across the thickness are calculated at the marked region C of the simulating domain 70. In some embodiments of the present disclosure, the shear rate is correlated with the velocity gradient tensor, and the shear rate profile can be obtained from the following expressions:

$$\dot{\gamma} = \sqrt{2D:D} \quad (13)$$

$$D = \frac{L + L^T}{2} \quad (14)$$

Where L=$\nabla$u is the velocity gradient tensor, $L^T$ is a transpose matrix of L, and D is the rate-of-deformation tensor. The shear rate is the double dot product of the rate-of-deformation tensor.

Figure 14:
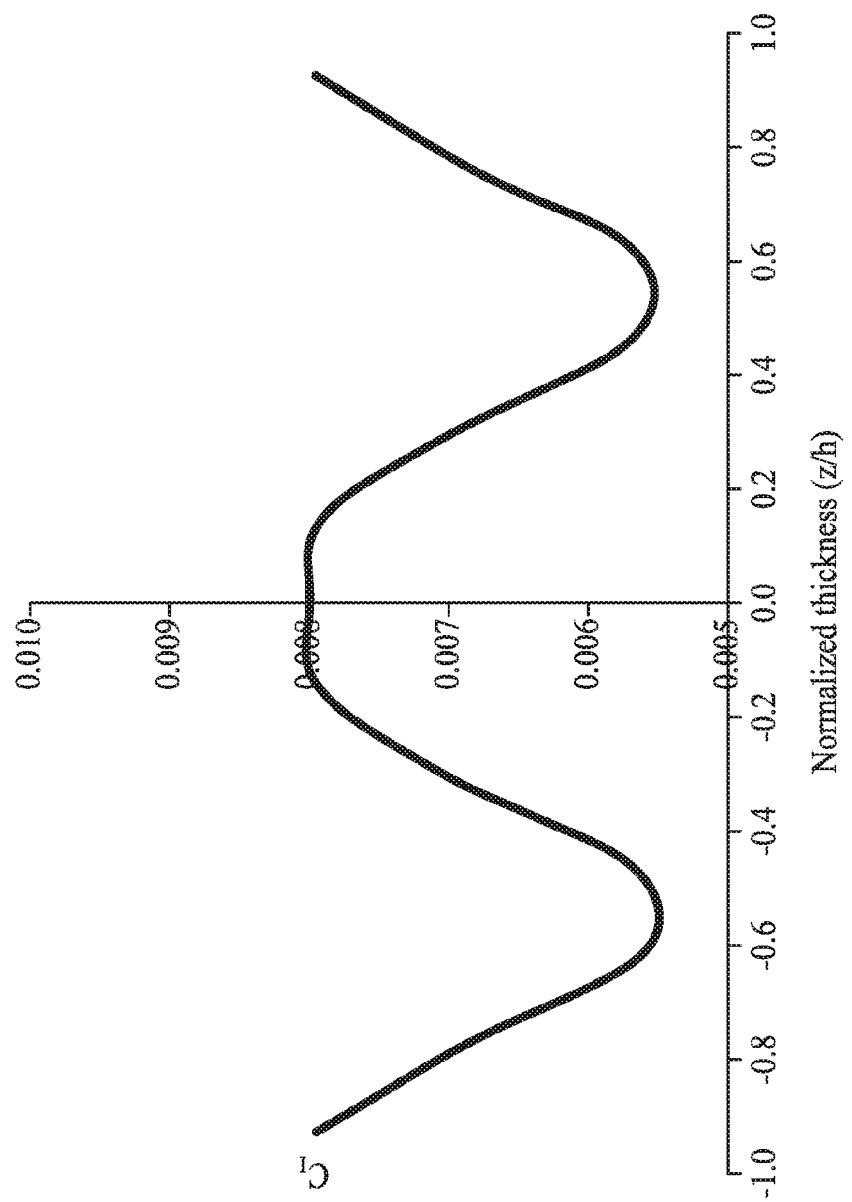
FIGS. 14 and 15 show the variation of the parameters, $C_I$ and $\alpha$, across the normalized thickness (z/h) from the shear rate profile in FIG. 13, respectively, in accordance with some embodiments of the present disclosure.
Figure 15:
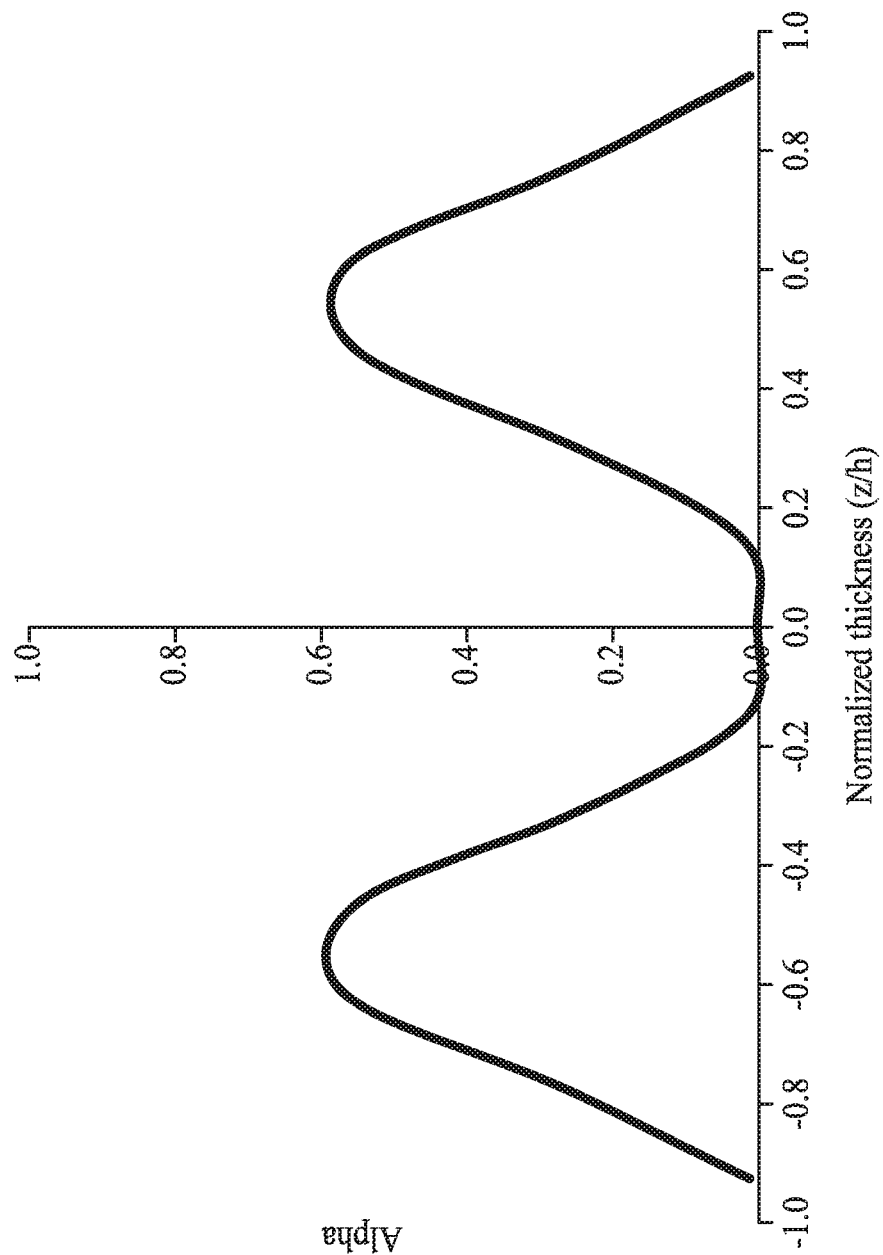

FIGS. 14 and 15 show the variation of the parameters, $C_I$ and $\alpha$, across the normalized thickness (z/h) from the shear rate profile in FIG. 13 and the equations (7) and (8) in accordance with some embodiments of the present disclosure. The parameters, $C_I$ and $\alpha$, are related to shear rate (shear-rate dependent parameters), across the thickness of the simulating domain 70 at the marked region C. In step 55, the fiber orientation distribution is generated by taking into consideration an anisotropic rotary diffusion of the fibers and the shear rate distribution (or the velocity gradient tensor). In some embodiments of the present disclosure, the anisotropic rotary diffusion is calculated by taking into consideration an effect of the shear rate on an inter-fiber interaction in the composite molding resin. In some embodiments of the present disclosure, the fiber orientation distribution is generated by taking into consideration an effect of the shear rate on a response rate of the fiber in the composite molding resin.

In some embodiments of the present disclosure, the fiber orientation distribution is generated by taking into consideration a decrease of the inter-fiber interaction in response to a decrease of the shear rate; for example, the decrease of the shear rate at the normalized thickness between −0.4 and 0.4 (core region) in FIG. 13, and the corresponding increase of the inter-fiber interaction (CS at the normalized thickness between −0.4 and 0.4 in FIG. 14. Similarly, in some embodiments of the present disclosure, the fiber orientation distribution is generated by taking into consideration a decrease of the parameter for slowing down the response rate of the fibers in response to an increase of the shear rate, for example, the decrease of the shear rate at the normalized thickness between −0.4 and 0.4 in FIG. 13, and the corresponding decrease of the parameter ($\alpha$) for slowing down the response rate of the fibers at the normalized thickness between −0.4 and 0.4 in FIG. 14, wherein the decrease of the parameter ($\alpha$) means the increase of the response rate of the fibers.

Figure 16:
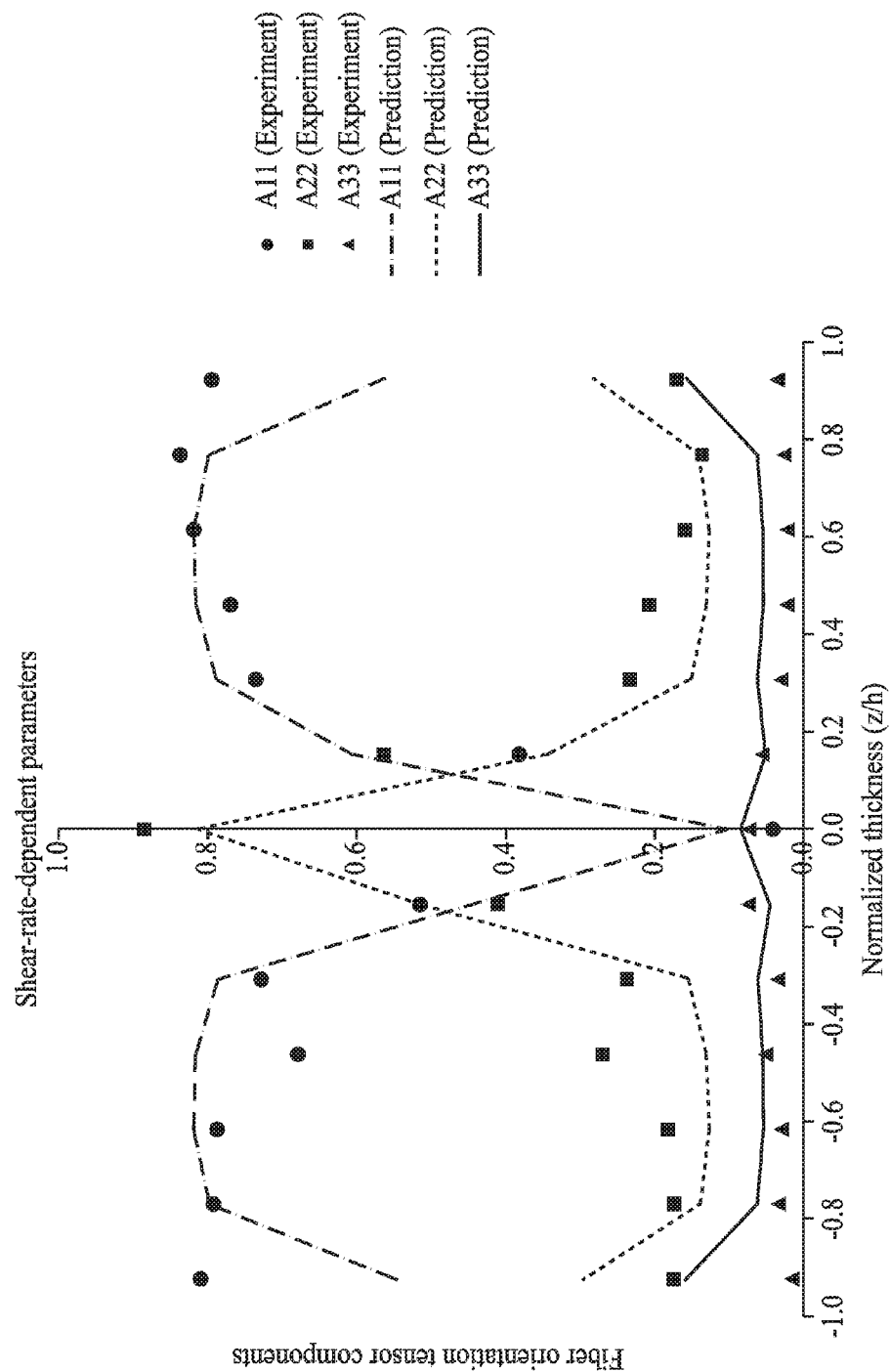
FIGS. 16 and 17 show the experimental and predicted fiber orientation distributions across the normalized thickness (z/h) of the molded FRT article at the marked region C in FIG. 4 in accordance with some embodiments and a comparative embodiment of the present disclosure, respectively.
Figure 17:
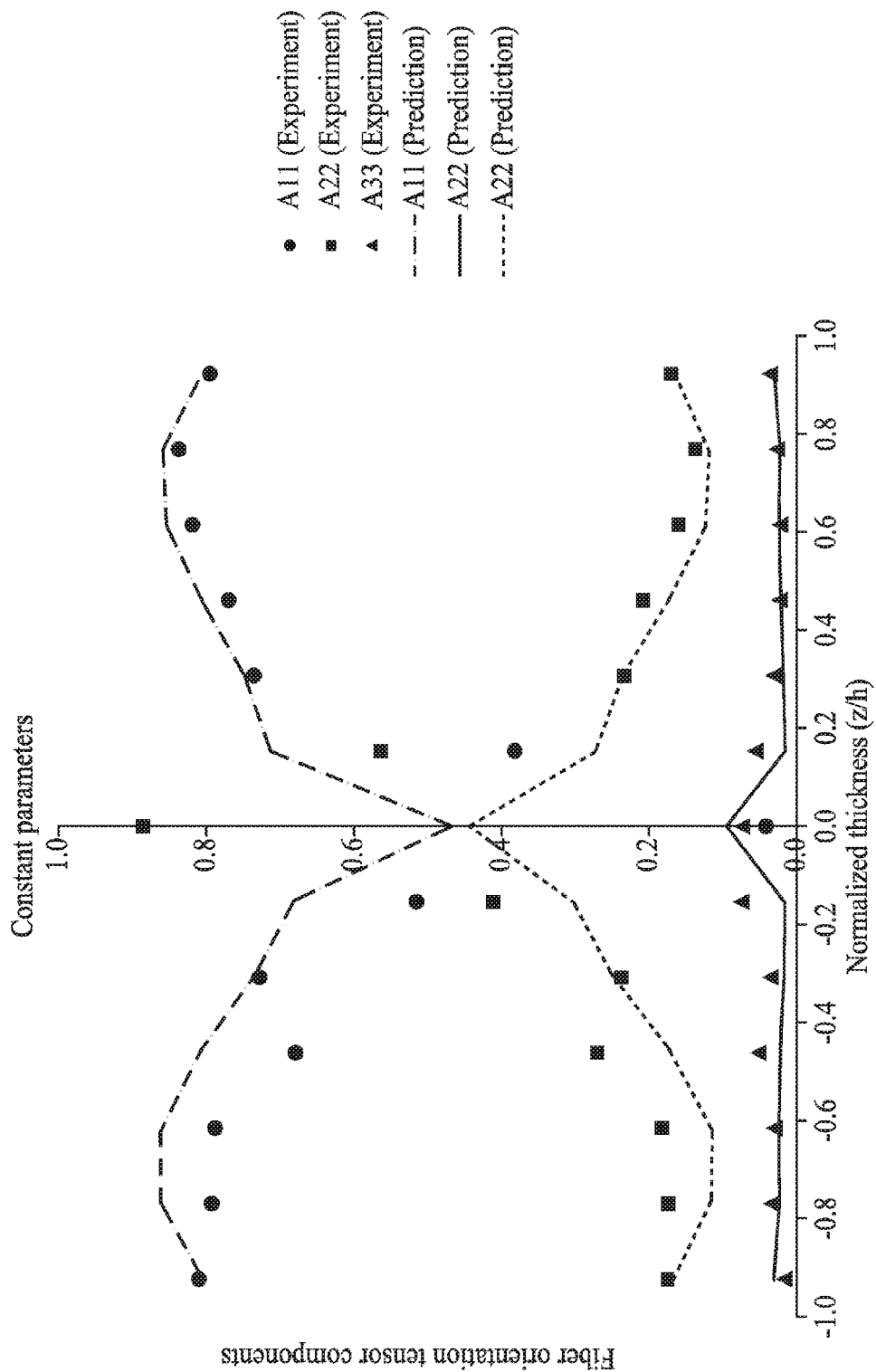

FIGS. 16 and 17 show the experimental and predicted fiber orientation distributions across the thickness of the molded composite article at the marked region C in FIG. 4 in accordance with some embodiments and a comparative embodiment of the present disclosure, respectively. FIG. 16 is generated using the shear-rate dependent parameters, while FIG. 17 is generated using the constant parameters. In FIG. 16, over the core region, both A11 and A22 curves obviously cross with lower A11 values and higher A22 values, matching the experiment data. In contrast, in FIG. 17, over the core region, it is obvious to find the over-predicted A11 value and the under-predicted A22 value, deviating from the experiment data. It is obvious that the variable (shear-rate-dependent) parameters considered in the iARD-RPR model can effectively improve upon inaccurate predictions made using the constant parameters.

In practice, mechanical performance depends on the fiber orientation state, including perfect alignment and random distribution, with a partial alignment representing a combination of perfect alignment and random distribution. For this reason, an integrative simulation is performed to determine the mechanical properties with respect to the fiber orientation state. A micromechanical material modeling software, Digimat-MF, based on the Mori-Tanaka Mean Field homogenization scheme, was used to calculate the mechanical properties of the FRT composites through inputting the fiber properties, wherein the fiber orientation state could be fixed, random or described by a second-order orientation tensor as predicted by injection-molding software, or measured experimentally.

From FIGS. 16 and 17, the thickness-averaged values of fiber orientation components A11, A22 and A33 are arranged in Table 1, including the experiment and predictions. Based on these values of fiber orientation components, the micromechanical material modeling software, Digimat-MF, is further used to obtain the maximum modulus E along the flow direction. As a result, the modulus of using the variable parameter is close to that of experimental value. In contrast, the predicted modulus using constant parameter certainly deviates from that of the experiment data. In other words, the prediction of fiber orientation strongly affects the estimation of the mechanical properties.

|  | Experiment | Variable parameter | Constant parameter |
|---|---|---|---|
| A11 | 0.6686 | 0.6765 | 0.7695 |
| A22 | 0.0385 | 0.2559 | 0.2032 |
| A33 | 0.2928 | 0.0676 | 0.0273 |
| E (GPa) | 7.7 | 7.8 (0.7%) | 8.8 (14%) |

Figure 18:
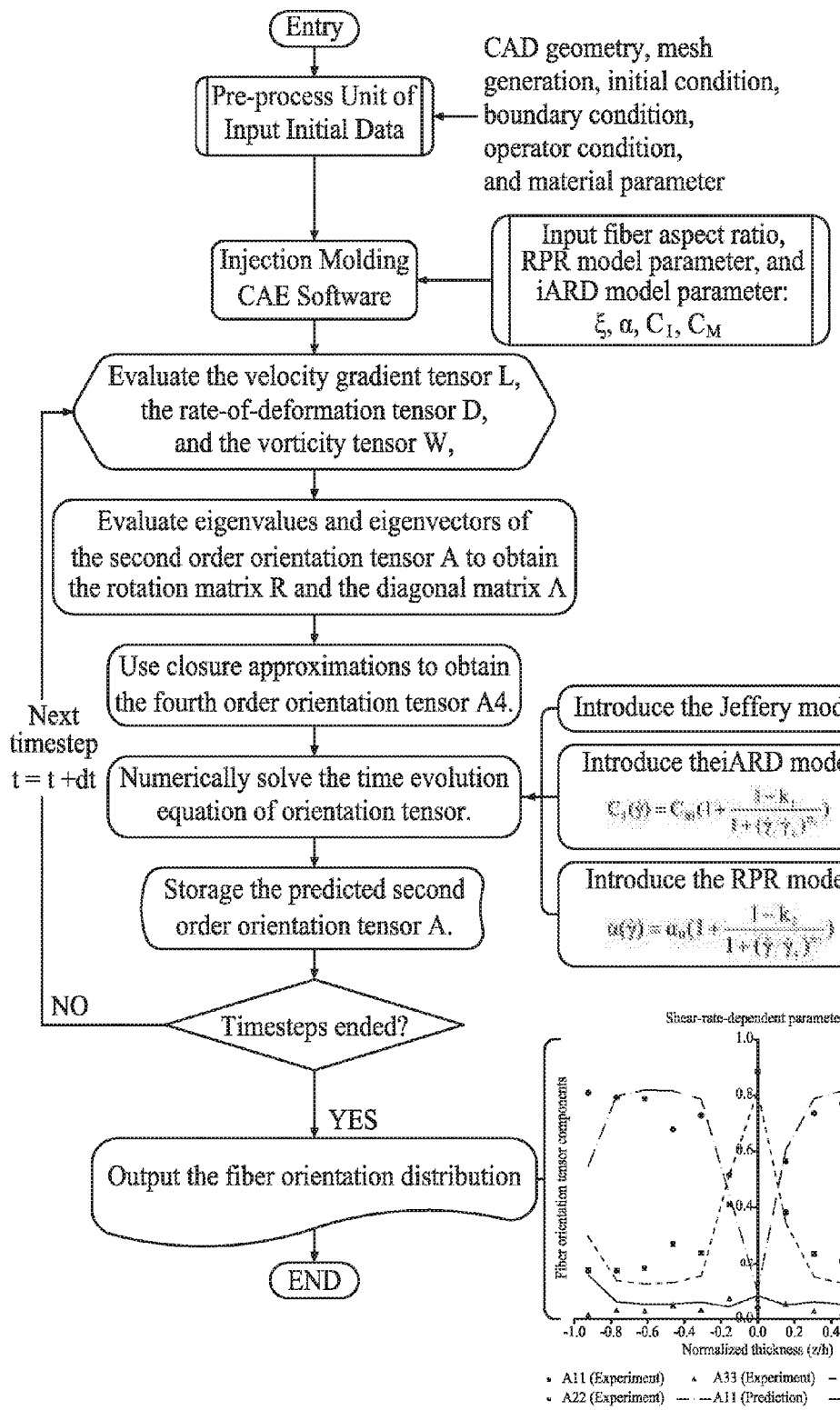
FIG. 18 is a flowchart showing an integration of the fiber orientation prediction technique and the CAE software in accordance with some embodiments of the present disclosure.

FIG. 18 is a flowchart showing an integration of the fiber orientation prediction technique and the CAE software in accordance with some embodiments of the present disclosure. As shown in FIG. 18, the CAE software for injection molding can offer a velocity gradient tensor in the filling flow field for the subsequent fiber-orientation analysis. Thus, the orientation analysis is able to determine an acceptable orientation tensor. It is important that the constitutive equation for fibers obtains the orientation tensor to calculate the fiber suspension stress tensor. In the next step, this stress tensor is returned to the CAE software for updating. Therefore, in future work, the embodiment of the fiber orientation program will play an important role and is helpful in present CAE development of injection molding for fiber reinforced composites.

The mechanical property of the molded article is correlated with the orientation distribution of the fibers. If the simulated orientation distribution of the fibers with the corresponding mechanical property does not meet the specification of the molded FRT article, the fiber parameters and/or the molding condition may be adjusted, and another simulation is performed to obtain an updated orientation distribution of the fibers in the composite molding resin while using the adjusted fiber parameter and/or the molding condition. To obtain the orientation distribution of the fibers in the composite molding resin injected into the model cavity, the present disclosure takes into consideration the effect of the shear rate on an inter-fiber interaction and/or the effect of the shear rate on a response rate of the fibers, i.e., using shear-rate-dependent parameters to physically model the effects of the shear rate on the inter-fiber interaction and the response rate of the fibers. Consequently, the present disclosure can accurately predict the orientation distribution of the fibers in the composite molding resin and the mechanical property of the molded FRT article.

One aspect of the present disclosure provides a method for preparing an injection-molded fiber-reinforced composite article using a molding machine controlled by a controlling module connected to the molding machine. The method comprises steps of: specifying a simulating domain corresponding to a genuine domain in a mold disposed on the molding machine, wherein the genuine domain has a mold cavity to be filled with a composite molding resin including a polymeric material having a plurality of fibers; performing a molding simulation executed on the controlling module to generate a shear rate distribution of the composite molding resin in the simulating domain while using a molding condition for the molding machine; generating an orientation distribution of the fibers in the composite molding resin executed on the controlling module by taking into consideration an effect of the shear rate on an inter-fiber interaction and/or an effect of the shear rate on a response rate of the fibers; and controlling the molding machine by the controlling module using the molding condition to perform an actual molding for injecting the composite molding resin into at least a portion of the genuine domain.

Another aspect of the present disclosure provides a non-transitory computer medium containing computer instructions stored therein for causing a computer processor to perform operations for use in a molding process simulation. The operations comprise steps of: specifying a simulating domain corresponding to a genuine domain in a mold disposed on the molding machine, wherein the genuine domain has a mold cavity to be filled with a composite molding resin including a polymeric material having a plurality of fibers; performing a molding simulation to generate a shear rate distribution of the composite molding resin in the simulating domain while using a molding condition for the molding machine; and generating an orientation distribution of the fibers in the composite molding resin by taking into consideration an effect of the shear rate on an inter-fiber interaction and/or an effect of the shear rate on a response rate of the fibers.

Another aspect of the present disclosure provides a molding system for preparing an injection-molded fiber-reinforced composite article. The molding system comprises a mold having a mold cavity; a molding machine configured to fill the mold cavity with a composite molding resin including a polymeric material having a plurality of fibers; a computing apparatus connected to the molding machine, wherein the computing apparatus is programmed to generate a shear rate distribution of the composite molding resin in the mold cavity while using a molding condition for the molding machine, and the computing apparatus is also programmed to generate an orientation distribution of the fibers in the composite molding resin by taking into consideration an effect of the shear rate on an inter-fiber interaction and/or an effect of the shear rate on a response rate of the fibers; and a controller connected to the computing apparatus and configured to control the molding machine with the molding condition to perform an actual molding for injecting the composite molding resin into at least a portion of the mold cavity.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A molding system for preparing an injection-molded fiber-reinforced composite article, comprising:
    a mold having a mold cavity;
    a molding machine configured to fill the mold cavity with a composite molding resin including a polymeric material having a plurality of fibers;
    a computing apparatus connected to the molding machine, wherein the computing apparatus comprises a processor configured to generate a shear rate distribution of the composite molding resin in the mold cavity while using a molding condition for the molding machine, and the processor is also configured to generate an orientation distribution of the fibers in the composite molding resin based on an effect of the shear rate on an inter-fiber interaction and/or an effect of the shear rate on a response rate of the fibers; and
    a controller connected to the computing apparatus and configured to control the molding machine with the molding condition to perform an actual molding for injecting the composite molding resin into at least a portion of the mold cavity.

2. The molding system of claim 1, wherein the processor is configured to generate the orientation distribution based on a decrease of the inter-fiber interaction in response to an increase of the shear rate.

3. The molding system of claim 1, wherein the effect of the shear rate on the inter-fiber interaction is represented using an expression:

$$C_I(\dot{\gamma}) = C_{I0}\left(1 + \frac{1-k_1}{1+(\dot{\gamma}/\dot{\gamma}_c)^{n_1}}\right)$$

where $C_I(\dot{\gamma})$ represents the inter-fiber interaction, and $\dot{\gamma}$ represents the shear rate.

4. The molding system of claim 1, wherein the processor is configured to generate the orientation distribution based on a decrease of the response rate of the fibers in response to an increase of the shear rate.

5. The molding system of claim 1, wherein the effect of the shear rate on the response rate of the fibers in the composite molding resin is represented using an expression:

$$\alpha(\dot{\gamma}) = \alpha_0\left(1 + \frac{1-k_2}{1+(\dot{\gamma}/\dot{\gamma}_c)^{n_2}}\right)$$

where $\alpha(\dot{\gamma})$ represents a parameter for slowing down the response rate of fibers, and $\dot{\gamma}$ represents the shear rate.

6. The molding system of claim 5, wherein the parameter for slowing down the response rate of fibers represents a blocking effect of a matrix on a movement of the fibers, and the matrix includes the polymeric material and a boundary of the mold.

* * * * *